US009887477B1

(12) United States Patent
Reed

(10) Patent No.: US 9,887,477 B1
(45) Date of Patent: Feb. 6, 2018

(54) FUSED-WIRE CABLE CONNECTORS FOR A BUSBAR

(71) Applicant: Ford Global Technologies, LLC, Dearborn, MI (US)

(72) Inventor: Glenn Richard Reed, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/273,539

(22) Filed: Sep. 22, 2016

(51) Int. Cl.

| | |
|---|---|
| ***H01R 12/00*** | (2006.01) |
| ***H05K 1/00*** | (2006.01) |
| ***H01R 4/00*** | (2006.01) |
| ***H01R 4/18*** | (2006.01) |
| ***H02G 3/06*** | (2006.01) |
| ***H02G 15/08*** | (2006.01) |
| ***H01R 13/02*** | (2006.01) |
| ***H01R 4/30*** | (2006.01) |
| ***H01R 43/16*** | (2006.01) |
| ***H01R 4/62*** | (2006.01) |

(52) U.S. Cl.
CPC ............. *H01R 13/025* (2013.01); *H01R 4/30* (2013.01); *H01R 4/62* (2013.01); *H01R 43/16* (2013.01)

(58) Field of Classification Search
CPC ...... H01R 4/023; H01R 9/226; H05K 5/0026; H02G 15/02
USPC ......................... 439/76.2, 874; 174/84 C, 74
See application file for complete search history.

(56) References Cited

U.S. PATENT DOCUMENTS

| | | | | |
|---|---|---|---|---|
| 3,912,358 A * | 10/1975 | Miller | H01R 4/62 | 174/84 C |
| 5,804,770 A * | 9/1998 | Tanaka | H01M 2/206 | 174/138 F |
| 6,053,780 A * | 4/2000 | Ono | H01R 4/34 | 439/810 |
| 6,322,376 B1 * | 11/2001 | Jetton | H01R 4/302 | 411/107 |
| 7,413,488 B2 * | 8/2008 | Matsumura | H01H 85/044 | 439/874 |
| 7,520,759 B2 * | 4/2009 | Seff | H02B 1/056 | 439/76.2 |
| 7,611,360 B2 * | 11/2009 | Akahori | H01R 4/185 | 439/76.2 |
| 7,754,374 B2 | 7/2010 | Hashida et al. | | |
| 7,914,300 B2 * | 3/2011 | Akahori | B60R 16/0238 | 439/76.2 |
| 8,480,423 B2 * | 7/2013 | O'Sullivan | H01R 11/03 | 439/287 |

(Continued)

FOREIGN PATENT DOCUMENTS

| | | | |
|---|---|---|---|
| CN | 202384423 | U | 8/2012 |
| CN | 204067475 | U | 12/2014 |
| CN | 204155992 | U | 2/2015 |

*Primary Examiner* — Abdullah Riyami
*Assistant Examiner* — Thang Nguyen
(74) *Attorney, Agent, or Firm* — James P. Muraff; Neal, Gerber & Eisenberg LLP

(57) ABSTRACT

Method, systems, and apparatus are disclosed for fused-wire cable connectors for a busbar. An example cable includes wires, insulation around the wires, and a connector extending from the wires beyond the insulation. The example connector is formed from ends of the wires that are fused together. The example connector defines an aperture that is to receive a fastener to couple the connector to a busbar.

20 Claims, 6 Drawing Sheets

(56) References Cited

U.S. PATENT DOCUMENTS

| | | | | |
|---|---|---|---|---|
| 8,926,246 | B2 * | 1/2015 | I | B60R 16/0238 411/107 |
| 9,011,188 | B2 * | 4/2015 | Aoki | H01R 4/023 439/874 |
| 2002/0053458 | A1 * | 5/2002 | Kondo | H01R 4/70 174/84 C |
| 2003/0155149 | A1 * | 8/2003 | Ota | H01R 11/03 174/84 C |
| 2011/0094797 | A1 * | 4/2011 | Otsuka | H01R 43/0207 174/84 C |
| 2014/0335385 | A1 | 11/2014 | Masaki Lkeya et al. | |

* cited by examiner

FUSED-WIRE CABLE CONNECTORS FOR A BUSBAR

TECHNICAL FIELD

The present disclosure generally relates to cable connectors and, more specifically, to fused-wire cable connectors for a busbar.

BACKGROUND

Vehicles and other systems utilize buses to distribute power to multiple pieces of equipment. Generally, a bus has a conductive busbar that is electrically coupled to a power source and includes a plurality of connection points. Typically, the connection points receive cables, which are coupled to corresponding equipment of the system, to facilitate distribution of power or a voltage signal from the source to the equipment of the system via the bus.

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are disclosed for fused-wire cable connectors for a busbar. An example disclosed cable includes wires, insulation around the wires, and a connector extending from the wires beyond the insulation. The example connector is formed from ends of the wires that are fused together. The example connector defines an aperture that is to receive a fastener to couple the connector to a busbar.

An example disclosed method to fabricate a cable connector includes forming a connector of a cable from ends of wires of the cable by inserting the ends into a mold, heating the ends, and fusing the ends together by pressing the heated ends into the mold. The example method includes forming an aperture in the connector that is to receive a fastener to couple the connector to a busbar.

An example disclosed electrical bus system includes a busbar including a port that defines a first aperture. The example system includes a cable including wires and a connector formed from ends of the wires that are fused together. The example connector defines a second aperture. The example system also includes a fastener to extend through the first aperture and the second aperture when the connector is received by the port to couple the connector of the cable to the port of the busbar.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
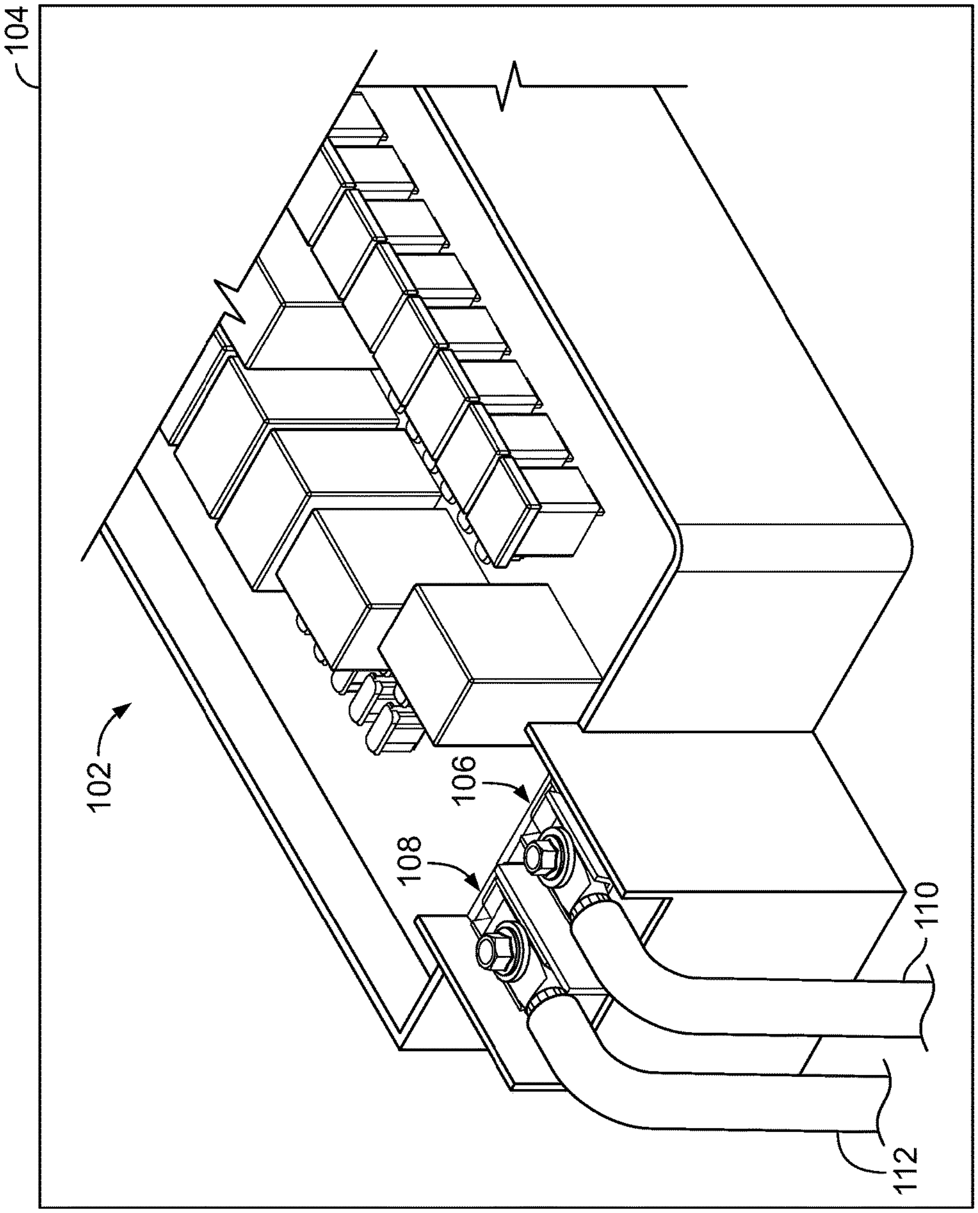
FIG. 1 illustrates a bus system in accordance with the teachings herein.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Oftentimes, buses are utilized to distribute power to multiple pieces of equipment within a system. For example, a vehicle may include a power distribution bus and/or a main electrical distribution bus that distributes power and/or a voltage signal to various electrical components of the vehicle. Buses typically have a conductive busbar that includes connection points and is electrically coupled to a power source (e.g., a battery). Each of the connection points may receive a cable that is coupled to a corresponding component of the system, thereby enabling the bus to distribute a voltage from the power source and to the system components. In some instances, the cable is coupled to the connection point by clamping wiring of the cable to the connection point. In other instances, a terminal is crimped on the wiring and is clamped to the connection point. Over time, the crimped terminal may loosen from the wiring and/or the connection point, potentially increasing electrical resistance between the cable and the busbar.

The example systems, apparatus, and methods disclosed herein facilitate a secure, low-resistance coupling between a cable and a busbar. An example cable disclosed herein includes conductive wires, insulation around the wires, and a connector formed from fused ends of the wires that extend beyond the insulation. The connector defines an aperture (e.g., a threaded aperture) that is to receive (e.g., threadably receive) fastener to enable the connector to securely couple the cable to a busbar (e.g., that distributes power to electrical components of a vehicle). In some examples, the connector has a trapezoidal (e.g., an isosceles trapezoidal) cross-section that enables a secure, torsional-resistant and/or low-resistance coupling between the connector and the busbar.

Additionally or alternatively, a surface of the connector is plated with a highly conductive material (e.g., tin, silver, gold, etc.) to increase a conductivity of the connection between the cable and the busbar.

In some examples, the wire-fused connector is received by a port of the busbar such that the aperture of the connector aligns with another aperture of the port. A fastener extends through the apertures of the connector and the port to couple the connector of the cable to the port of the busbar. The port may include a protrusion that engages an end of the connector to enable the apertures to align. Additionally or alternatively, the port includes a base and opposing flanges protruding from the base. To electrically couple the cable to the busbar, the connector contacts the base and/or at least one of the flanges of the port. In some examples, the port has a trapezoidal cross-section that is less than the trapezoidal cross-section of the connector to enable the connector to press fit, wedge and/or otherwise be securely inserted into to the port. Further, at least one of the flanges may include ribs that scratch, scrape or cut into a surface of the connector as the connector is inserted into the port to remove or fracture oxidation that has formed on the surface of the connector. By removing the surface oxide from the connector, electrical resistivity is reduced between the connector and the port.

The fused-wire connector is formed by inserting the ends of the wires into a mold and heating the ends to a temperature at which the ends may fuse together. The ends of the wires may be heated by a localized heat source, solid state diffusion and/or friction produced by an ultrasonic horn. Further, the heated ends are pressed into the mold to fuse the ends together to form the connector. For example, an anvil applies a force to the ends of the wires to press the ends into the mold. In some examples, the mold has a trapezoidal cross-section to form a connector having a trapezoidal cross-section. Further, upon forming the connector by fusing the ends of the wires of the cable, the connector may be cooled and the aperture subsequently may be formed by drilling or punching the aperture into the connector.

Turning to the figures, FIG. 1 depicts an example bus 102 of a vehicle 104 in accordance with the teachings herein. The vehicle 104 may be a standard gasoline powered vehicle, a hybrid vehicle, an electric vehicle, a fuel cell vehicle, and/or any other mobility implement type of vehicle. The vehicle 104 includes parts related to mobility, such as a power-train with an engine, a transmission, a suspension, a driveshaft, and/or wheels, etc. The vehicle 104 may be non-autonomous, semi-autonomous (e.g., some routine motive functions controlled by the vehicle 104), or autonomous (e.g., motive functions are controlled by the vehicle 104 without direct driver input).

The bus 102 may be a power distribution bus, a main electrical distribution bus and/or any other type of bus that distributes power and/or a voltage signal to one or more electrical components in the vehicle 104. The bus 102 includes ports 106, 108 that receive cables 110, 112 to distribute power and/or a voltage signal to the components of the vehicle 104. For example, the cable 110 (e.g., a first cable) is coupled to the bus 102 via the port 106 (e.g., a first port), and the cable 112 (e.g., a second cable) is coupled to the bus 102 via the port 108 (e.g., a second port). For example, each of the cables 110, 112 is coupled to a respective electrical component of the vehicle 104 to distribute power and/or a voltage signal, via the bus 102, from a power source to that electrical component. In other examples, one of the cables 110, 112 may be coupled to the power source and the other of the cables 110, 112 may be coupled to another electrical component of the vehicle 104 to distribute a voltage to the other component of the vehicle 104.

Figure 2:
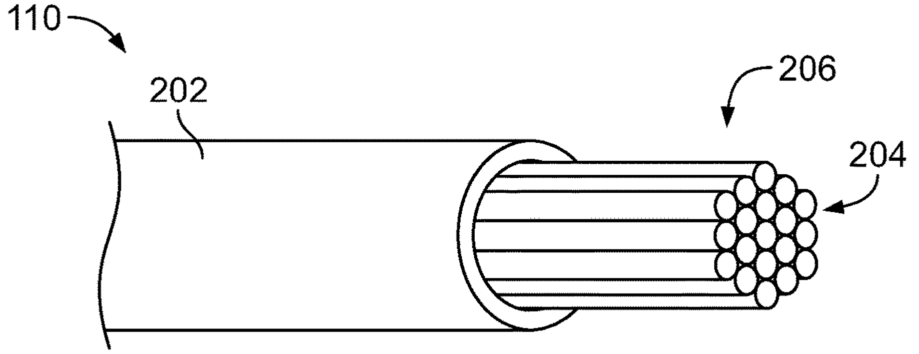
FIG. 2 illustrates an end of a cable of the bus system of FIG. 1.

FIG. 2 depicts a portion of the cable 110 that is coupled to the bus 102 of FIG. 1. The cable 110 includes insulation 202 extending around wires 204 that is dielectric to cover and/or insulate the wires 204. As illustrated in FIG. 2, ends 206 of the wires 204 extend beyond and/or protrude from the insulation 202. For example, a portion of the insulation 202 may be stripped to enable the ends 206 of the wires 204 to extend beyond the insulation 202. The wires 204 contain aluminum, copper and/or any other conductive material that may be melted to fuse together. Further, the insulation 202 contains a thermoplastic, a thermoset, and/or any other material that insulates the wires 204 from a surrounding environment.

Figure 3:
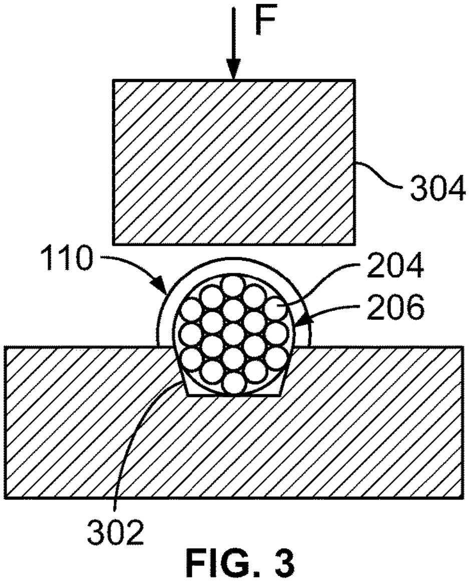
FIG. 3 is a cross-sectional view of a mold and an anvil that form a cable connector in accordance with the teachings herein.

FIG. 3 is a cross-section of an example mold 302 and an example anvil 304 that form a cable connector (e.g., a connector 400 of FIGS. 4-5 and 7-10 and/or a connector 902 of FIGS. 9-10) in accordance with the teachings herein. As illustrated in FIG. 3, the end 206 of the wires 204 of the cable 110 is inserted into the mold 302. Further, the wires 204 are heated via a localized heat source, an ultrasonic horn that produces friction, solid state diffusion, and/or any other apparatus or method that is able to heat the ends 206 of the wires 204 to their melting point. Upon heating the wires 204 and positioning the ends 206 into the mold 302, the anvil 304 applies a force to the wires 204 to press the exposed portion of the wires 204 into the mold 302 to fuse the ends 206 of the wires 204 into the cable connector. That is, the ends 206 of the wires 204 are heated and inserted into the mold 302, and the anvil 304 applies a force to the ends 206 to form the ends 206 of the wires 204 into the cable connector.

In the illustrated example, the mold 302 has a trapezoidal cross-section to cause the mold 302 and the anvil 304 to fuse the ends 206 of the wires 204 together into a corresponding trapezoidal cross-section of the cable connector. More specifically, the cross-section of the mold 302 and the corresponding cross-section of the cable connector may be an isosceles trapezoid. In other examples, the mold 302 and the cable connector formed by the mold may have any other cross-section that enables the cable connector to electrically couple to the bus 102 in a secure and/or low-resistive manner.

Further, in some examples, the mold 302 may have a length that is greater than that of the ends 206 of the wires 204 such that a portion of the mold 302 is initially unfilled by the wires 204 of the cable 110. When the force is applied to the wires 204, the heated material of the wires 204 flows into the portion of the mold 302 that is initially unfilled by the wires 204, thereby preventing the heated material of the wires 204 from overflowing from the mold 302 when the force is applied via the anvil 304.

Figure 4:
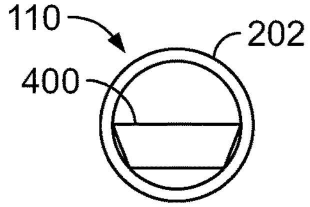
FIG. 4 is a front view of a cable connector formed at the end of the cable of FIG. 2.
Figure 5:
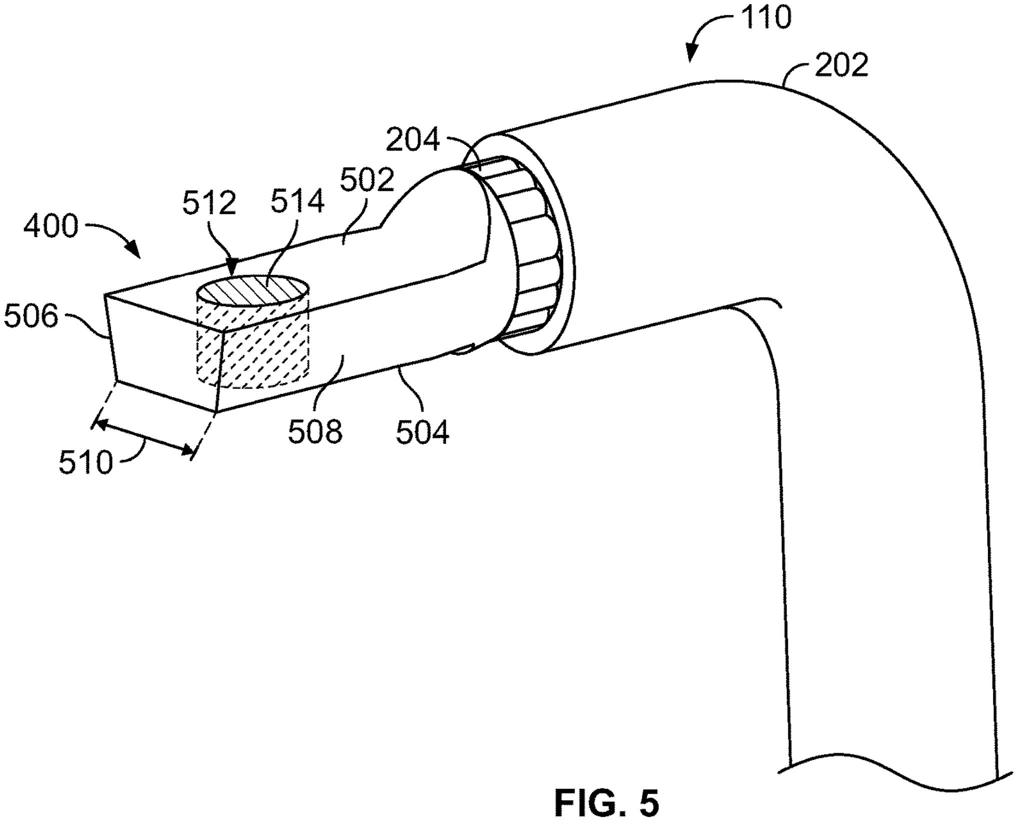
FIG. 5 is a perspective view of the cable connector of FIG. 4.

FIGS. 4 and 5 depict an example connector 400 of the cable 110 that is formed, for example, via the mold 302 and the anvil 304 of FIG. 3. More specifically, FIG. 4 is a front view and FIG. 5 is a perspective view of the connector 400 of the cable 110.

As illustrated in FIG. 4, the connector 400 of the cable 110 has a trapezoidal (e.g., an isosceles trapezoidal) cross-section (e.g., a first trapezoidal cross-section) that enables the connector 400 to be securely received by and/or to form a low-resistance electrical coupling with the port 106 of the bus 102. However, the connector 400 may have any other cross-section that enables the connector 400 to form a secure, low-resistive coupling to the bus 102. Further, because the connector 400 is formed from the wires 204 of the cable 110, the connector 400 contains the same material as the wires 204 such as aluminum and/or copper.

FIG. 5 further depicts the connector 400 of the cable 110 that is formed from the wires 204 and protrudes beyond the insulation 202. The connector 400 includes a surface 502 (e.g., a first surface), an opposing surface 504 (e.g., a second surface), and opposing side surfaces 506, 508 (e.g., a first side surface and a second side surface, respectively) extending between the opposing surfaces 502, 504. The surfaces 502, 504 define the bases and the side surface 506, 508 define legs of the trapezoidal cross-section of the connector 400. In the illustrated, the surface 504 has a width 510 that defines the shorter of the bases of the trapezoidal cross-section.

Further, as illustrated in FIG. 5, the connector 400 defines an aperture 512 that extends between the surface 502 and the surface 504 of the connector 400. The aperture 512 is to receive a fastener (e.g., a fastener 802 of FIG. 8) that couples the connector 400 to the port 106 to electrically couple the cable 110 to the bus 102. In some examples, the aperture 512 includes threads 514 that receive a threaded fastener to enable the threaded fastener to couple to the connector 400. In other examples, the aperture 512 is not threaded.

Figure 6:
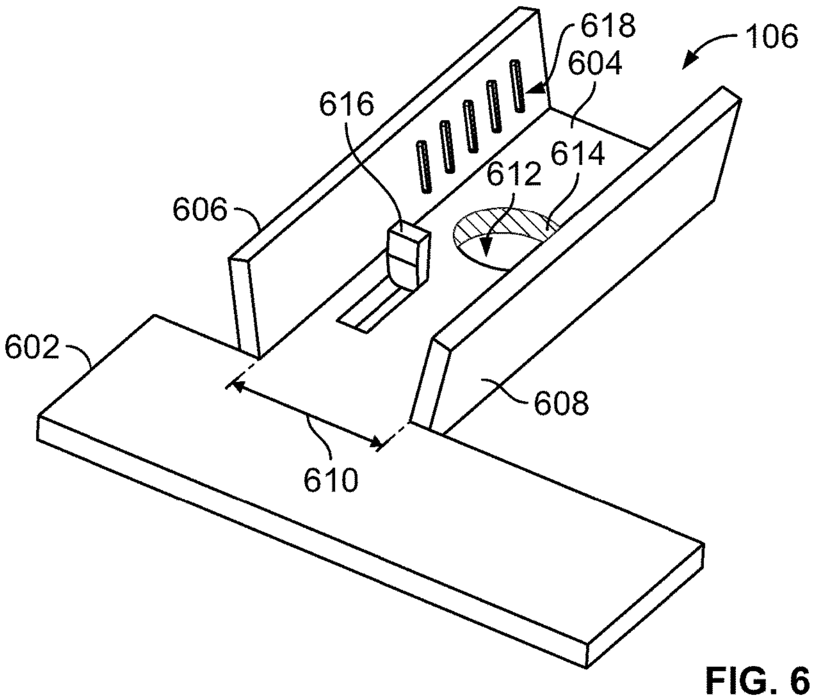
FIG. 6 illustrates a port of a busbar of the bus system of FIG. 1 that is to receive the cable connector of FIGS. 4-5.

FIG. 6 illustrates the port 106 of a busbar 602 of the bus 102 that is to receive the connector 400 of the cable 110 in accordance with the teachings herein. The busbar 602, including the port 106, contains aluminum, copper and/or any other conductive material to enable power and/or a voltage signal to be distributed from a power source (e.g., a battery) and through the busbar 602 to an electrical component of the vehicle 104.

The port 106 includes a base 604, a flange 606 (e.g., a first flange), and another flange 608 (e.g., a second flange). In the illustrated example, the flange 606 protrudes from the base 604 in a first direction and the flange 608 protrudes from the base 604 in an opposing second direction to define a trapezoidal (e.g., an isosceles trapezoidal) cross-section (e.g., a second trapezoidal cross-section) of the base 604. For example, the first trapezoidal cross-section of the port 106 is less than the second trapezoidal cross-section of the connector 400 such that a width 610 of the base 604 of the port 106 is less than the width 510 of the surface 502 of the connector 400. As a result, the connector 400 may be press fit and/or wedged into the port 106 to further securely couple the connector 400 of the cable 110 to the port 106.

As illustrated in FIG. 6, the base 604 defines an aperture 612 of the port 106 that is to receive the fastener (e.g., the fastener 802 of FIG. 8) to couple the connector 400 to the port 106. In the illustrated example, the aperture 612 includes threads 614 that receive a threaded fastener to couple to the threaded fastener to the port 106 of the busbar 602. In other examples, the aperture 612 of the port 106 is not threaded. The example port 106 also includes a protrusion 616 extending from the base 604 of the port 106. The protrusion 616 is to engage a portion of the connector 400 to enable the aperture 612 of the port 106 to align with the aperture 512 of the connector 400 to enable the apertures 512, 612 to receive the fastener to couple the connector 400 to the port 106.

Further, in the illustrated example, the flange 606 and/or the flange 608 includes ribs 618 that scratch, scrape, and/or cut into the side surface 506 of the connector 400 as the connector 400 is inserted into and/or received by the port 106 to remove or fracture oxidation of the side surface 506 of the connector 400. For example, surface oxides may form along the side surface 506, the surface 502, the surface 504, and/or the side surface 508 of the connector 400 as a result of the wires 204 being fused together to form the connector 400. In some instances, the surface oxides may increase a resistivity between connector 400 and the port 106. Thus, the ribs 618 potentially further reduce the contact resistance of the coupling between the connector 400 and the port 106 by removing oxidation from the side surface 506 of the connector 400. Additionally or alternatively, the flange 608 and/or the base 604 of the port 106 includes the ribs 618 to remove oxidation from the side surface 508 and/or the surface 504, respectively, to remove oxidation from the connector 400. Further, the ribs 618 may extend into the connector 400 to prevent creep or joint relaxation between the connector 400 and the port 106 to further secure the connector 400 in the port 106.

Figure 7:
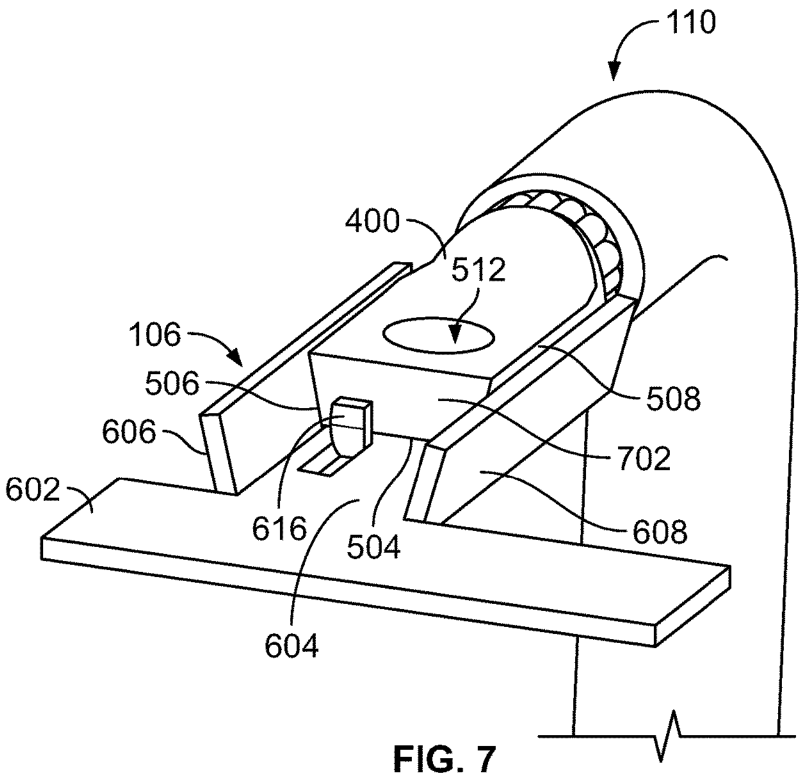
FIG. 7 illustrates the port of FIG. 6 receiving the cable connector of FIGS. 4-5.

FIG. 7 depicts the connector 400 of the cable 110 and the port 106 of the busbar 602 when the connector 400 is inserted into and/or received by the port 106. As illustrated in FIG. 7, the protrusion 616 of the port 106 engages an end 702 of the connector 400 to limit movement of the connector 400 relative the port 106. For example, the protrusion 616 deters the connector 400 from being inserted into the port 106 beyond a predetermined point to align the aperture 512 of the connector 400 with the aperture 612 of the port 106. Thus, by inducing alignment of the apertures 512, 612, the protrusion 616 facilitates a fastener to extend through the apertures 512, 612 to couple the connector 400 to the port 106.

Further, the connector 400 and the port 106 of the illustrated example have respective trapezoidal cross-sections so that at least one surface of the connector 400 contacts at least one surface of the port 106 when the connector 400 is received by the port 106. For example, the connector 400 and the port 106 have trapezoidal cross-sections to enable the surface 504 and the base 604, the side surface 506 and the flange 606 and/or the side surface 508 and the flange 608 to contact each other when the connector 400 is inserted into the port 106. Thus, the trapezoidal cross-sections of the connector 400 and the port 106 facilitate an electrical coupling between the connector 400 of the cable 110 and the port 106 of the busbar 602.

In the illustrated example, the connector 400 is wedged and/or press fit into the port 106 to enable the connector 400 to be securely coupled to the port 106. For example, the connector 400 is nominally larger than the port 106 so that the surface 504 contacts the base 604, the side surface 506 contacts the flange 606, and the side surface 508 contacts the flange 608 when the connector 400 is received by the port 106. Because multiple surfaces of the connector 400 contact multiple respective surfaces of the port 106, the conductivity of the coupling between the connector 400 and the port 106 is increased. Additionally or alternatively, one or more surfaces of the connector 400 and/or the port 106 are plated with highly conductive material (e.g., tin, silver, gold) to further increase the conductivity of the coupling between the connector 400 and the port 106. For example, at least one of the surface 504 and the side surfaces 506, 508 of the connector 400 and/or at least one of the base 604 and the flange 606, 608 is plated to reduce the contact resistance of the coupling between the connector 400 and the port 106.

Figure 8:
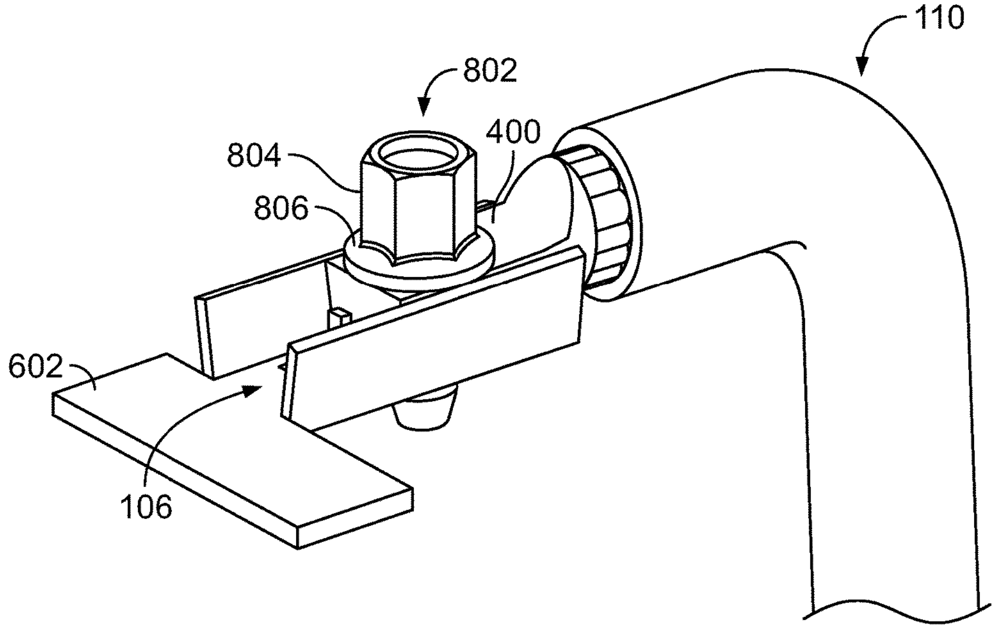
FIG. 8 illustrates the cable connector of FIGS. 4-5 coupled to the port of FIG. 6 via a fastener.

FIG. 8 depicts the connector 400 of the cable 110 coupled to the port 106 of the busbar 602 via a fastener 802 in accordance with the teachings herein. The fastener 802 of the illustrated example includes a bolt 804, a washer 806, and a nut. For example, the bolt 804 extends through the washer 806, the aperture 512 of the connector 400, and the aperture 612 of the port 106 and is received (e.g., threadably received) by the nut to couple the connector 400 of the cable

110 to the port 106. In other examples, the bolt 804 couples the connector 400 to the port 106 without a bolt by being threadably received by the threads 614 of the aperture 612 of the port 106. Further, in some examples, the washer 806 is a Belleville washer or a spring washer that further secures the connector 400 to the port 106 by maintaining a clamp load between the bolt 804 and the nut and/or by preventing creep or joint relaxation between the connector 400 and the port 106.

Figure 9:
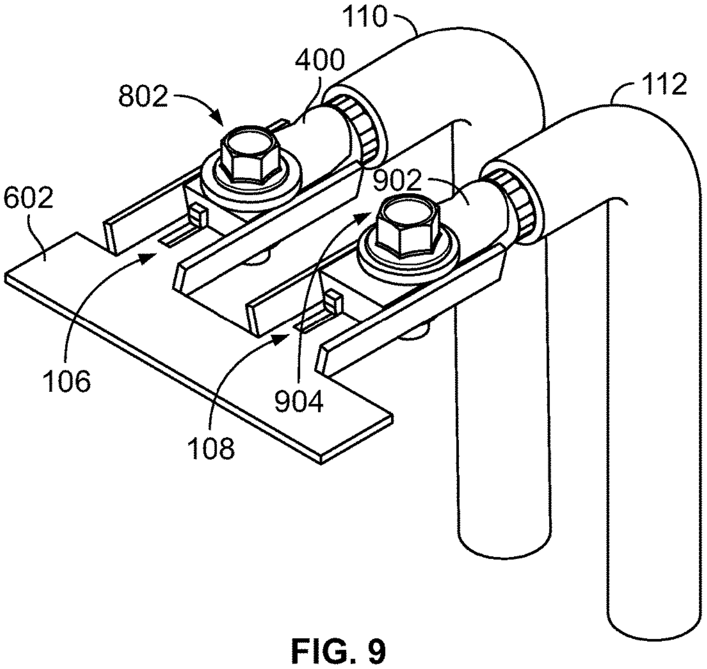
FIG. 9 is a perspective view of cable connectors that are received by respective ports of the busbar of the bus system of FIG. 1.

FIG. 9 is a perspective view of the cables 110, 112 coupled to the busbar 602 via the respective ports 106, 108. As illustrated in FIG. 9, the connector 400 of the cable 110 is coupled to the port 106 of the busbar 602 via the fastener 802, and a connector 902 of the cable 112 is coupled to the port 108 of the busbar 602 via a fastener 904. The connector 902 is substantially similar or identical to the connector 400 and the fastener 904 is substantially similar or identical to the fastener 802. Because the connector 400 is described in detail in connection with FIGS. 4-5 and 7-8 and the fastener 802 is described in detail in connection with FIG. 8, some characteristics of the connector 902 and the fastener 904 of FIG. 9 are not described in further detail below.

Returning to FIG. 1, the ports 106, 108 and the respective cables 110, 112 enable the busbar 602 of the bus 102 to distribute power and/or a voltage signal provided by a power source to multiple components within the vehicle 104. For example, the busbar 602 may distribute, via the port 106 and the connector 400, a voltage to a component of the vehicle 104 that is coupled to the cable 110. Further, the busbar 602 may distribute, via the port 108 and the connector 902, the same voltage to another component of vehicle 104 that is coupled to the cable 112.

Figure 10:
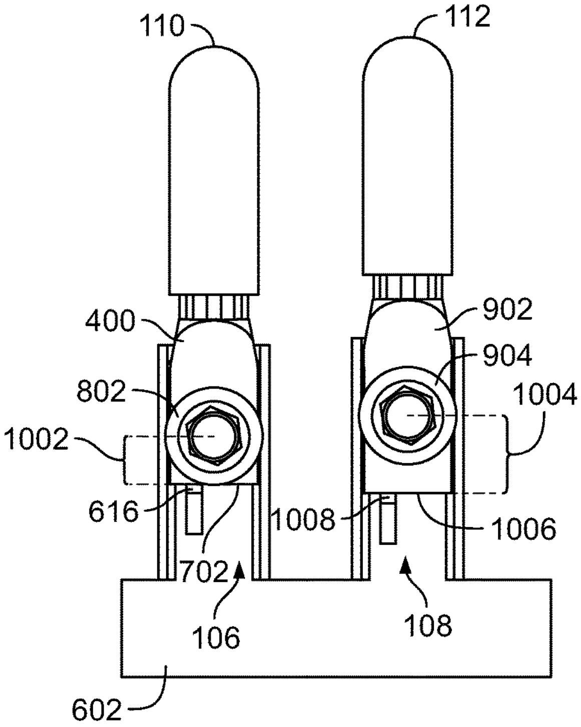
FIG. 10 is a top view of the cable connectors and the ports of FIG. 9.

FIG. 10 is a top view of the cables 110, 112 coupled to the busbar 602 via the respective ports 106, 108. In the illustrated example, the end 702 of the connector 400 is spaced apart from a center of the aperture 512 by a distance 1002, and the protrusion 616 is spaced apart from a center of the aperture 612 of the port 106 by the distance 1002. Further, a distance 1004 separates a center of an aperture of the connector 902 and an end 1006 of the connector 902, and the 1004 distance separates a center of an aperture of the port 108 and a protrusion 1008 of the port 108.

As illustrated in FIG. 10, the distance 1004 is different than (e.g., greater than) the distance 1002 to facilitate the cables 110, 112 to be coupled to the corresponding ports 106, 108 for which they are designated. That is, the distance 1002 enables the cable 110 to be inserted into the designated port 106, and the distance 1004 enables the cable 112 to be inserted into the designated port 108. For example, the apertures 512, 612 of the connector 400 and the port 106 align when the connector 400 is inserted into the port 106, because the end 702 of the connector 400 and the protrusion 616 of the port 106 are spaced apart from the corresponding apertures 512, 612 by the same distance 1004. If the connector 400 with the corresponding distance 1002 was inserted into the port 108 with the corresponding distance 1004, the aperture 512 of the connector 400 would not align with the aperture of the port 108. Similarly, the apertures of the connector 902 and the port 108 align when the connector 902 is inserted into the port 108, because the end 1006 of the connector 902 and the protrusion 1008 of the port 108 are spaced apart from the corresponding apertures by the same distance 1004. The aperture of the connector 902 would not align with the aperture 612 of the port 106 if the connector 902 was inserted into the port 106.

Figure 11:
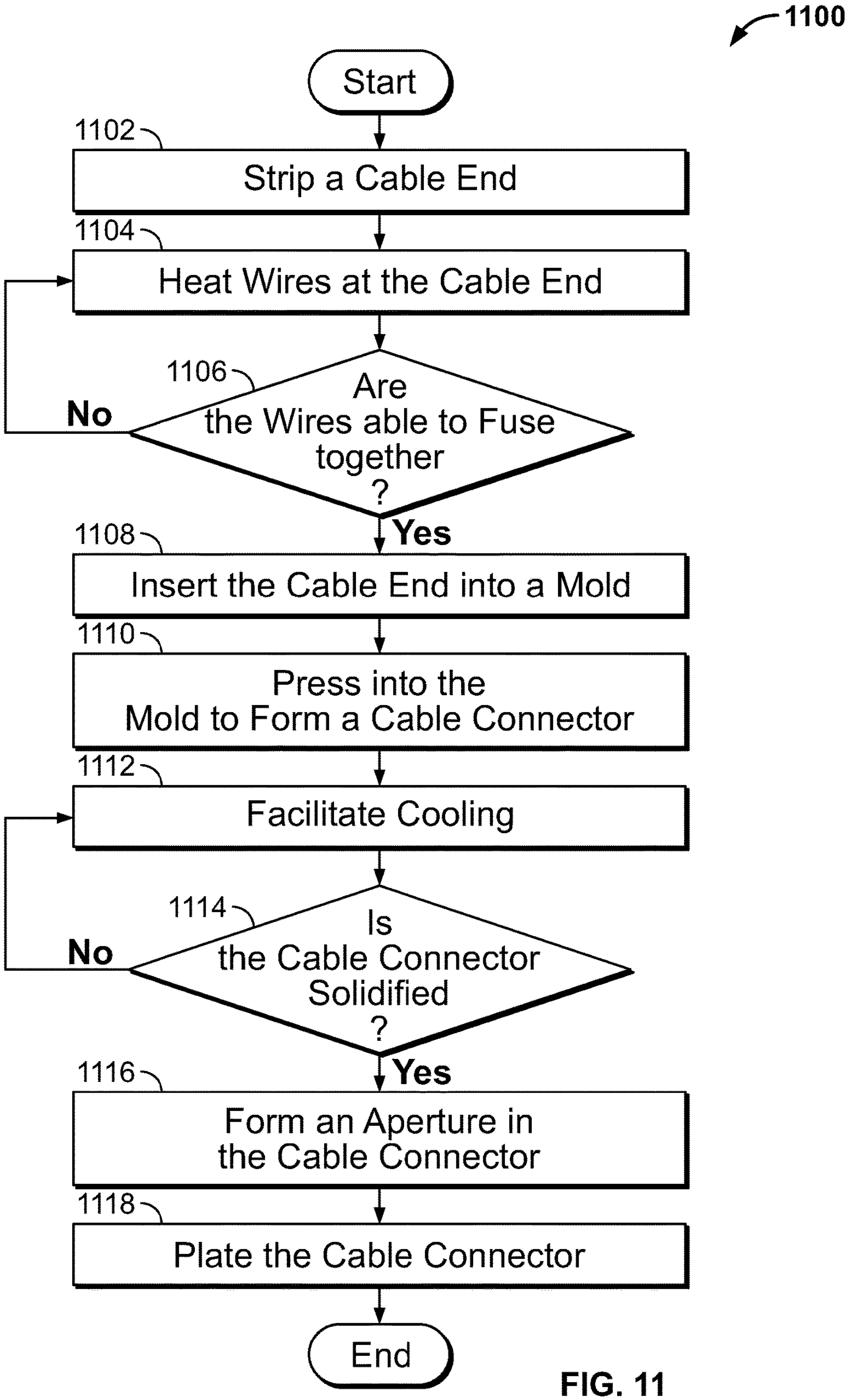
FIG. 11 is a flowchart of a method to form the cable connector of FIGS. 4-5 and 7-10 and/or the cable connector of FIGS. 9-10 in accordance with the teachings herein.

FIG. 11 is a flowchart of an example method 1100 to form a wire-fused cable connector in accordance with the teachings herein. In some examples, the flowchart of FIG. 11 is representative of machine readable instructions that are stored in memory and include one or more programs executed to form a wire-fused cable connector. While the example program(s) is/are described with reference to the flowchart illustrated in FIG. 11, many other methods for forming a wire-fused cable connector may alternatively be used. For example, the order of execution of the blocks may be rearranged, changed, eliminated, and/or combined to perform the method 1100.

The method 1100 is disclosed in connection with the components of FIGS. 3-5 and 7-10. Thus, some functions of those components will not be described in detail below. Further, while the method 1100 is disclosed below in connection with fabrication of the connector 400 of FIGS. 4-5 and 7-10, the method 1100 may be utilized to fabricate the connector 902 and/or any other wire-fused cable connector.

Initially, at block 1102, a cable end of the cable 110 is stripped of the insulation 202. At block 1104, the cable end (e.g., the ends 206 of the wires 204) is heated. For example, the cable end is heated via a localized heat source, solid state diffusion and/or friction produced by an ultrasonic horn. At block 1106, the method 1100 includes determining whether the cable end of the cable 110 has been heated to a temperature at which the ends 206 of the wires 204 are able to be fused together. If the wires 204 are not able to be fused together, the method 1100 returns to block 1104. Otherwise, if the wires 204 are able to be fused together, the method 1100 continues to block 1108 at which the cable end is inserted into the mold 302. At block 1110, the cable end is pressed into the mold 302 via the anvil 304 to form a cable connector (e.g., the connector 400). For example, a cable end is pressed into the mold having a trapezoidal cross-section to enable the cable connector to have a trapezoidal cross-section.

At block 1112, the method 1100 includes facilitating cooling of the cable connector. At block 1114, the method 1100 includes determining whether the cable collector has solidified and/or hardened. If the cable collector has not solidified, the method 1100 returns to block 1112. Otherwise, if the cable collector has solidified, the method 1100 proceeds to block 1116 at which the aperture 512 is formed in the cable connector. For example, the aperture 512 is formed via punching or drilling the aperture 512 into the cable connector. In some examples, the aperture 512 is further formed by the threading the aperture 512. At block 1118, a surface (e.g., the surface 502, the surface 504, the side surface 506, the side surface 508) of the cable connector is plated to increase conductivity of the cable connector. For example, the cable connector contains aluminum and/or copper and is plated with tin, silver, and/or gold.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A bus system comprising: a busbar including a port that defines a first aperture and includes a protrusion; a cable including wires and a connector formed from fused ends of the wires and defining a second aperture; and a fastener to extend through the first aperture and the second aperture to couple the connector to the port, the protrusion engages an end of the connector to align the first aperture and the second aperture.

2. The system of claim 1, wherein the busbar distributes at least one of power and a voltage signal to electrical components of a vehicle.

3. The system of claim 1, wherein the port includes a base, a first flange protruding from the base, and a second flange protruding from the base opposite the first flange, the connector is to contact at least one of the base, the first flange, and the second flange of the port.

4. The system of claim 3, wherein at least one of the first flange and the second flange includes ribs that scratch a surface of the connector as the connector is inserted into the port to remove oxidation of the surface of the connector.

5. The system of claim 4, wherein the connector includes aluminum, has a trapezoidal cross-section, and includes a surface that is plated.

6. The system of claim 1, wherein the connector has a first trapezoidal cross-section and the port has a second trapezoidal cross-section.

7. The system of claim 6, wherein the first trapezoidal cross-section is larger than the second trapezoidal cross-section to produce a press fit between the connector and the port.

8. The system of claim 6, wherein the first trapezoidal cross-section is an isosceles trapezoid and the second trapezoidal cross-section is an isosceles trapezoid.

9. The system of claim 1, wherein the cable includes insulation around the wires and the connector extends from the wires beyond the insulation.

10. The system of claim 1, wherein the second aperture defined by the connector is threaded to threadably receive the fastener.

11. The system of claim 1, wherein the wires and the connector formed from the fused ends of the wire include aluminum.

12. The system of claim 1, wherein the connector of the cable included aluminum, has a trapezoidal cross-section, and includes a surface that is plated.

13. A busbar system comprising:

a busbar including a port that defines a first aperture and include ribs, and a protrusion;

a cable including wires and a connector formed from fused ends of the wires and defining a second aperture; and a fastener to extend through the first aperture and the second aperture to couple the connector to the port, the ribs to scratch a surface of the connector as the connector is inserted into the port; and the protrusion engages an end of the connector to align the first aperture and the second aperture.

14. The system of claim 13 wherein the cable includes: insulation around the wires and the connector extends from the wires beyond the insulation.

15. The system of claim 13, wherein the connector has a trapezoidal cross-section.

16. The system of claim 6, wherein the trapezoidal cross-section is an isosceles trapezoid.

17. The cable of claim 13, wherein the second aperture of the connector is threaded to threadably receive the fastener.

18. The system of claim 13, wherein the wires and the connector that is formed from the fused end of the wires include aluminum.

19. The system of claim 13, wherein the port includes a base, a first flange protruding from the base, and a second flange protruding from the base opposite the first flange, the connector is to contact at least one of the first flange and the second flange of the port.

20. The system of claim 19, wherein at least one of the first flange and the second flange includes the ribs that scratch the surface of the connector as the connector is inserted into the port to remove oxidation of the surface of the connector.

* * * * *